United States Patent
Palaniswami

[11] Patent Number: 6,144,219
[45] Date of Patent: Nov. 7, 2000

[54] SYSTEM AND METHOD FOR ISOLATION OF VARYING-POWER BACKED MEMORY CONTROLLER INPUTS

[75] Inventor: Krishnan Palaniswami, Austin, Tex.

[73] Assignee: Advanced Micro Devices, Inc., Sunnyvale, Calif.

[21] Appl. No.: 08/785,896

[22] Filed: Jan. 21, 1997

Related U.S. Application Data

[63] Continuation of application No. 08/548,498, Oct. 26, 1995, abandoned.

[51] Int. Cl.[7] .............................. H03K 17/16; G11C 7/00
[52] U.S. Cl. ............................. 326/33; 365/226; 365/228; 327/530; 327/538
[58] Field of Search .................................. 326/33, 21, 9; 327/530, 538; 365/226, 227, 228, 229

[56] References Cited

U.S. PATENT DOCUMENTS

| | | |
|---|---|---|
| 4,791,614 | 12/1988 | Arakawa ................................. 365/228 |
| 4,827,149 | 5/1989 | Yabe ....................................... 365/229 |
| 5,083,293 | 1/1992 | Gilberg et al. ......................... 365/228 |
| 5,206,938 | 4/1993 | Fujioka .................................. 365/228 |
| 5,226,006 | 7/1993 | Wang et al. ............................ 365/228 |

*Primary Examiner*—Michael Tokar
*Assistant Examiner*—Anh Q. Tran

[57] ABSTRACT

An isolation mechanism serves to isolate digital signal processor outputs from a dynamic random access memory controller upon the occurrence of a low power condition. The isolation prevents corruption of dynamic random access memory due to low power. The isolation mechanism receives inputs of a first low power indicator and a second low power indicator. The first low power indicator pulls low and the second low power indicator is forced high when a low power condition exists. One embodiment of the isolation mechanism includes a NAND gate connected to a first low power indicator signal and to a second low power indicator signal as inputs, a NOR gate connected with a NAND gate output as input, and a flip flop connected with a NOR gate output and the first low power indicator as inputs. The flip flop output is input to the NOR gate.

13 Claims, 2 Drawing Sheets

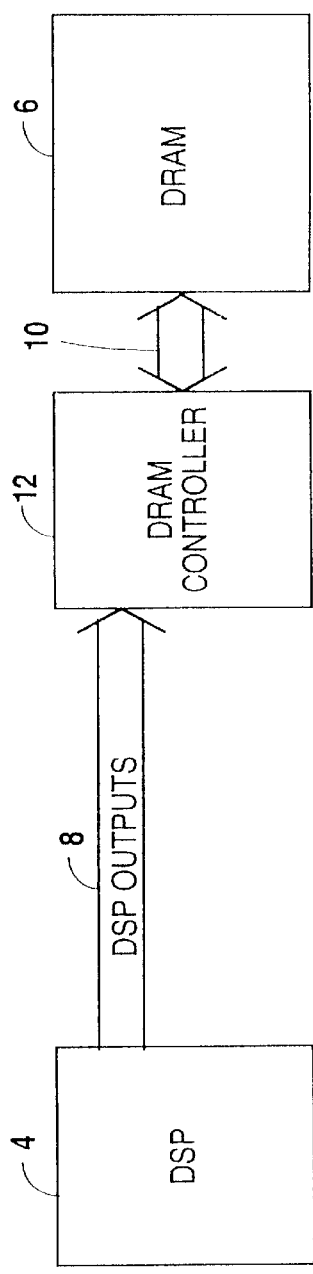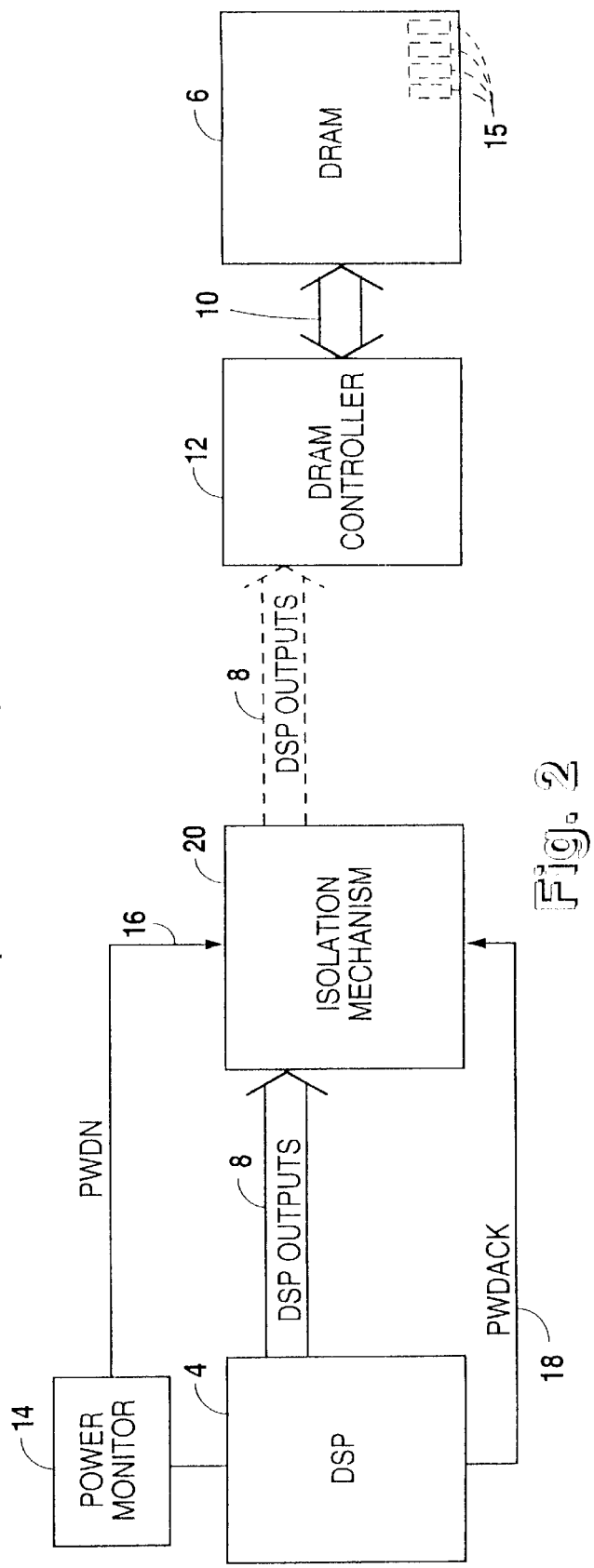

SYSTEM AND METHOD FOR ISOLATION OF VARYING-POWER BACKED MEMORY CONTROLLER INPUTS

This is a continuation, of application Ser. No. 08/548,498, filed Oct. 26, 1995 now abandoned.

BACKGROUND OF THE INVENTION

The present invention relates to operations verifications in electronic devices powered by a varying power source and, more particularly, to a system and method of automatic isolation of battery backed DRAM controller inputs from processor outputs upon power shutdown.

Many electronic devices are powered by a varying or fluctuating power source. A common power source for electronics devices is a battery. Power supplied by a battery varies because of depletion over time of the battery's charge. Other power sources for electronics devices may also vary, either by depletion or in other manners.

Electronics devices, for desired operations of those devices, often require power supplies that are maintained within certain minimum or maximum limits. This may be true, for example, for electronics devices incorporating certain processing capabilities. As power wanes or reaches critical limits, processor operations may vary from normal, expected operations. Some of the reasons for that variation in operations caused by power supply variations may include, for example, clock rate, signal timing, inappropriate interrupt generation, and a wide variety of others.

Certain types of electronics devices, in particular, digital devices, may require or include some type of memory storage. There are various types of memories that are known. Those memories may be employed in electronics devices, for example, in conjunction with a processor. A particular type of memory, known as dynamic random access memory (DRAM), is a read/write type of semiconductor memory that uses a capacitor as the storage cell. DRAMs must be repeatedly refreshed or their data will be lost. In order to accomplish the repeated refreshment and also to allocate information to DRAM storage locations, a DRAM controller is typically employed in conjunction with the DRAM to manage those functions.

A special type of processor for electronics devices is a digital signal processor (DSP). DSPs may be employed in a wide variety of applications. In many of those applications, it is desirable to use some form of memory in conjunction with the DSP, for example, for storage of DSP outputs. DRAM, for example, may serve as memory in conjunction with DSP operations.

DSPs, like various other processors, may perform irregularly when a power supply to the DSP varies. A DSP powered by a battery, for example, may output floating (high-impedance) state signals when power to the DSP is lost or substantially reduced. This may occur upon a total loss of power or, as is common, when a battery power source is depleted to a minimum, critical level of power. In that instance of power source depletion, memory serving for DSP output storage may receive the DSPs floating state output signals and, thus, the memory may contain corrupt data. This may be the case, for example, when the memory is DRAM. As previously mentioned, DRAM is dynamic memory and must be repeatedly refreshed and so is typically controlled by a DRAM controller. If faulty output signals from a DSP are input to a DRAM controller, the data stored in the DRAM controlled by the controller will be corrupted.

The present invention overcomes the problems associated with power variation, such as, for example, critically low battery power previously described. In particular, embodiments of the invention may serve to prevent corruption of DRAM and data therein stored because of faulty DSP output signals input to a DRAM controller, attributable to lost or depleted battery supply. The present invention, thus, provides significant advantages and improvements in the art and technology.

SUMMARY OF THE INVENTION

An embodiment of the invention is an isolation mechanism. The isolation mechanism receives inputs of a first low power indicator and a second low power indicator. The first low power indicator pulls low and the second low power indicator is forced high when power to a device incorporating the mechanism is low. The isolation mechanism comprises a NAND gate connected, with the first low power indicator and the second low power indicator as inputs, a NOR gate, connected with the NAND gate output as input, and a flip flop, connected with the NOR gate output and the first low power indicator as inputs, wherein the flip flop output is input to the NOR gate.

BRIEF DESCRIPTION OF THE DRAWINGS

FIG. 1 is a simplified, functional block illustration of a typical dynamic random access memory (DRAM) controlled by a battery backed DRAM controller, the controller receiving inputs which are outputs of a digital signal processor (DSP);

FIG. 2 is a simplified, functional block illustration of a mechanism, according to embodiments of the present invention, for automatic isolation of battery backed DRAM controller inputs from DSP outputs, responsive to power shutdown, which shutdown may be total loss or substantial depletion of power.

DESCRIPTION OF PREFERRED EMBODIMENTS

Figure 3:
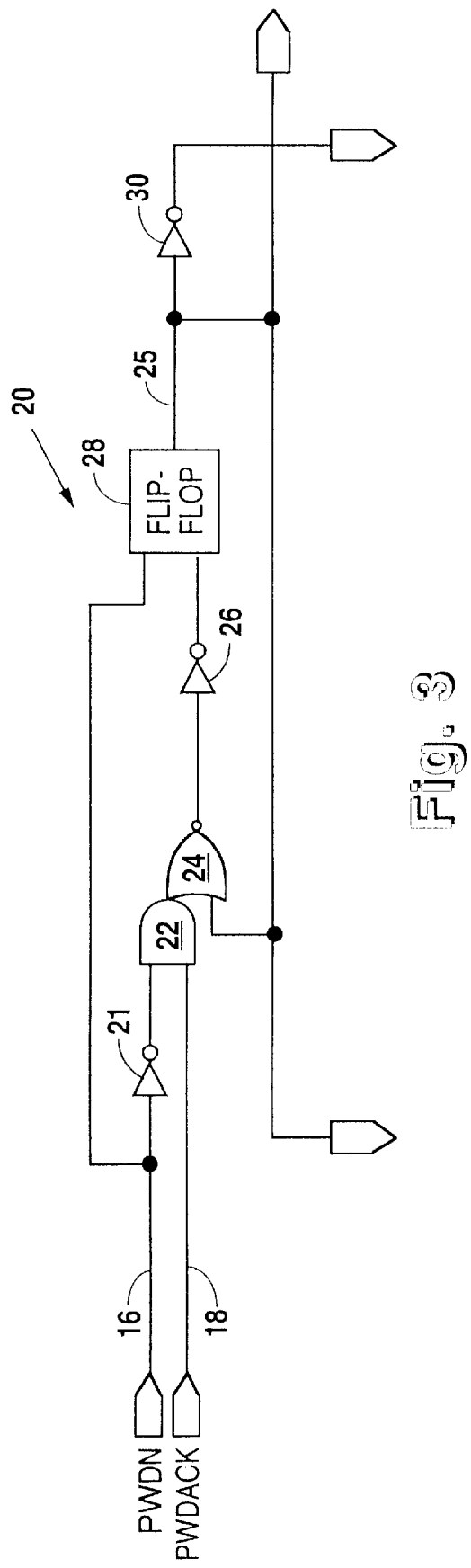
FIG. 3 is a detailed schematic of the mechanism for automatic isolation shown in FIG. 2, according to embodiments of the present invention, in operation in conjunction with a DSP, power monitor chip, DRAM controller, and DRAM.

Referring to FIG. 1, a typical dynamic random access memory (DRAM) 6 is controlled by a DRAM controller 12. The DRAM controller 12 receives outputs 8 from a processor, such as, for example, a digital signal processor (DSP) 4. The outputs 8 of the DSP 4 are inputs to the DRAM controller 12. The DRAM controller 12 operates to control the DRAM 6 as dictated by the DSP 4 outputs 8.

As may be understood, if the DSP 4, DRAM controller 12, and DRAM 6 system are powered by a varying power source (not shown), for example, a battery, the DSP 4, the DRAM controller, and the DRAM 6 may be affected. If the varying power source affects the DSP 4 operation when the power varies, the DSP 4 may pass undesirable outputs 8 to the DRAM controller 12, for example, the undesirable outputs 8 may be floating (high-impedance) state signals. Those outputs 8, when input to the DRAM controller 12, may disturb desired operation of the DRAM controller 12.

Referring now to FIG. 2, an isolation mechanism 20, according to embodiments of the present invention, is shown in use with a DSP 4 and a DRAM 6 controlled by a DRAM controller 12. In the embodiment, the isolation mechanism 20 is connected between the DSP 4 and the DRAM 6. In the typical configuration shown in FIG. 1, the DSP 4 outputs 8 connect directly to the DRAM controller 12 of the DRAM 6. In the embodiment of the present invention, in FIG. 2, however, the DSP outputs 8 connect with the isolation mechanism 20 and the isolation mechanism 20 outputs 8 connect connects with the DRAM controller 12. As in the typical configuration, the DRAM controller 12 controls the memory storage functions of the DRAM 6.

The isolation mechanism 20 is particularly configured with the DSP 4 and the DRAM controller 12 in order to receive the DSP 4 outputs 8 before those outputs 8 pass to the DRAM controller 12. Because of this configured location of the isolation mechanism 20, the outputs 8 of the DSP 4 may be selectively isolated by the isolation mechanism 20 from passage to the DRAM controller 12.

Although a wide variety of processors could be isolated in similar manners from various types of memory, a particularly useful application of the isolation mechanism 20 is in connection with the DSP 4, the DRAM controller 12, and the DRAM 6. One particular embodiment employs the isolation mechanism 20 with an ADSP 2171 digital signal processor obtainable from Advanced Micro Devices, Inc. That particular processor emits a power down acknowledged (PWDACK) signal 18 indicative of a low power condition. In addition to the PWDACK signal 18 as an indicator of the low power condition, the DSP 4 may be connected to and monitored by a power monitor chip 14, as those skilled in the art will know and appreciate. The power monitor chip 14 may output a power down (PWDN) signal 16 when low power is indicated. When those signals 16, 18 are active, a low power condition exists, and the isolation mechanism 20 isolates the DRAM controller 12 so that it does not receive outputs 8 from the DSP 4.

As has been stated, the DRAM controller 12 serves to direct signals for DRAM 6 storage into appropriate memory elements 15 of the DRAM 6. By isolating the DSP 4 outputs 8, in the aforedescribed manner, from the DRAM controller 12 at the isolation mechanism 20, the DRAM controller 12 does not receive as inputs to it any of the outputs 8 of the DSP 4. Because the outputs 8 of the DSP 4 are isolated at the isolation mechanism 20, the outputs 8 do not pass to the data of DRAM controller 12 and so do not corrupt the DRAM 6.

Now referring to FIG. 3, a schematic diagram of the isolation mechanism 20 is shown in detail. The isolation mechanism 20, according to certain embodiments, is a logic circuit which receives the PWDN signal 16 from the power monitor chip 14 (shown in FIG. 2) upon a low power condition. In the embodiment, upon sensing the low power condition, the power monitor chip 14 sends an active low signal as the PWDN signal 16. Also upon the low power condition, the DSP 4 (shown in FIG. 2) operation is interrupted from its normal operation through a non-maskable low power (PWD) hardware interrupt (not shown in detail). After receiving the interrupt, the DSP 4 performs certain necessary operations in the interrupt routine to save relevant data into DRAM 6 and then goes into a power down state. At that point, the power down state of the DSP 4 is then indicated by raising the PWDACK signal 18 to an active high signal. In any instance of full power loss, the DSP 4 output pin that delivers the PWDACK signal 18 then floats in a tri-state condition.

The isolation mechanism 20 takes as inputs the PWDN signal 16 from the power monitor chip 14 (shown in FIG. 2) and the PWDACK signal 18 from the DSP 4. The PWDN signal 16 is split into two branches. One branch connects to a first inverter 21 and the other branch connects to a flip flop, for example, an SR latch 28. The output from the first inverter 21 is an input to an AND gate 22. The PWDACK signal 18 is the other input to the AND gate 22. The output of the AND gate 22 is an input to a NOR gate 24. The other input to the NOR gate 24 is the output of the SR latch 28, as hereinafter described.

The output of the NOR gate 24 passes to a second inverter 26. The output of the second inverter 26 is another input to the SR latch 28. The output of the SR latch 28 is branched. One branch connects the second input to the NOR gate 24. The branch is also an output 32 of the isolation mechanism 20. The other branch of the SR latch 28 is input to a third inverter 30. The output 34 of the third inverter 30 is another output of the isolation mechanism 20.

In operation of the isolation mechanism 20, according to the embodiment, when the PWDN signal 16 from the power monitor chip 14 (shown in FIG. 2) goes active low and the PWDACK signal 18 from the DSP 4 (shown in FIG. 2) goes high because of a low power condition, the two signals after being ANDed, form a signal used to set the SR latch 28. The output of the SR latch 28 then pulls the Set input of the SR latch 28 to logic high and isolates the output from the PWDACK signal 18 using the AND 22 gate and NOR 24 gate complex gate. When the $V_{cc}$ drops to zero, therefore, the floating state of the PWDACK output and all of the other outputs 8 from the DSP 4 are isolated from and can not affect the operation of the DRAM controller 12 (shown in FIG. 2).

When sufficient power is resumed, the PWDN signal 16 is forced logic high by the power monitor chip 14 (shown in FIG. 2) and the SR latch 28 is reset. The inputs to the DRAM controller 12 are then opened to accept the DSP 4 outputs 8.

It is to be understood that multiple variations, changes and modifications are possible in the aforementioned embodiment of the invention described herein. Although certain illustrative embodiments of the invention have been shown and described here, a wide range of modification, change, and substitution is contemplated in the foregoing disclosure and, in some instances, some features of the present invention may be employed without a corresponding use of the other features. Accordingly, it is appropriate that the foregoing description be construed broadly and understood as being given by way of illustration and example only, the spirit and scope of the invention being limited only by the appended claims.

What is claimed is:

1. An isolation circuit for isolating data input to a memory controller device during low power conditions, comprising:

a first low power indicator input signal having an active state;

a second low power indicator input signal having an active state;

a digital logic blcok having an output and having a first input connected to said first low power indicator signal and a second inut connected to said second low power indicator signal, and having a NAND gate an input connected to said first low power indicator input signal, a NOR gate with an input connected to an output of said NAND gate, and a Flip-Flop with one input connected to an output of said NOR gate and another input connected to said first low power indicator input signal;

wherein in response to said first and said second low power indicator input signals entering its respective active state, said output of said digital logic block enters a logic state to signify a lower power condition has occurred.

2. The isolation circuit of claim 1, wherein an output of said Flip-Flop is connected to another input of said NOR gate.

3. A low power memory fresh isolation system, comprising:
   a) a first low power indicator input signal having an active state;
   b) a second low power indicator input signal having an active state;
   c) a digital logic block having an output and having a first input connected to said first low power indicator signal and a second input connected to said second low power indicator signal;
   d) a DSP circuit having data output signals and a first low power indicator signal output;
   e) a power monitor circuit having a second low power indicator signal output;
   f) a memory data refresh controller circuit having data inputs connected to said DSP data outputs, having an input connected to said second low power indicator signal output, and having data outputs;
   wherein in response to the event when said first and second low power indicator input signals each enter their respective active state, said memory data refresh controller circuit data ouputs become disabled.

4. The low power memory refresh isolation system of claim 3, further comprising a memory circuit having data inputs connected to said memory data refresh controller circuit data outputs.

5. The low power memory refresh isolation system of claim 3, wherein said memory data refresh controller circuit comprises a DRAM controller circuit.

6. The low power memory fresh isolation system of claim 4, wherein said memory circuit comprises a DRAM.

7. The low power memory refresh isolation system of claim 3, wherein said first low power indicating input signal has a first active state and said second low power indicator input signal has a second active state.

8. The low power memory refresh isolation system of claim 7, wherein said first active state has a logical value opposite that of said second active state.

9. A method of isolating data output from a memory refresh device from a memory circuit input during periods of low power, comprising the steps of:
   a) providing a data refresh isolation circuit;
   b) providing a memory data refresh circuit;
   c) providing a DSP circuit;
   d) inputting DSP data from said DSP circuit to said data refresh isolation circuit;
   e) providing a plurality of low power indicator signals, each having a respective active state, to said data refresh isolation circuit;
   f) disabling DSP data output from said data refresh isolation circuit in response to the event when said plurality of low popwer indicator signals all enter their respective active state, indicating a low power condition has occurred.

10. The method of claim 9, further comprising the step of providing a memory circuit having data inputs connected to said DSP data output from said data refresh isolation circuit.

11. The method of claim 9, wherein at least one of said plurality of low power indicator signals is output from a power monitor circuit.

12. The method of claim 9, wherein at least one of said plurality of low power indicator signals is output from said DSP circuit.

13. An arrangement of isolating data output from a memory refresh device from a memory circuit input during periods of low power, comprising:
   means for isolating a data fresh;
   refresh means for refreshing memory data;
   DSP means for processing digital signals;
   means for passing data from the DSP means to the refresh means;
   signaling means for outputting a plurality of lower power indicator signals, each having a respective active state, to the refresh means;
   means, responsive to each of the plurality of lower power indicator signals entering its active state, for disabling data from passing from the DSP means to the refresh means.

* * * * *